United States Patent [19]

Naaseh-Shahry et al.

[11] Patent Number: 5,812,830

[45] Date of Patent: Sep. 22, 1998

[54] DEBUG SYSTEM WITH RAW MODE TRIGGER CAPABILITY

[75] Inventors: Hosein Naaseh-Shahry, Windsor; Paul G. Tobin, Fort Collins, both of Colo.

[73] Assignee: Hewlett-Packard Company, Palo Alto, Calif.

[21] Appl. No.: 749,863

[22] Filed: Nov. 14, 1996

[51] Int. Cl.$^6$ .................................................. G06F 11/00
[52] U.S. Cl. ...................... 395/551; 395/557; 395/183.01
[58] Field of Search .................................. 395/551, 557, 395/559, 183.01, 183.08, 183.09, 183.13, 184.01; 371/22.1, 22.6

[56] References Cited

U.S. PATENT DOCUMENTS

| | | | |
|---|---|---|---|
| 4,678,345 | 7/1987 | Agoston | 368/119 |
| 4,713,813 | 12/1987 | Sugimori et al. | 371/22.1 |
| 4,910,417 | 3/1990 | El Gamal et al. | 307/465 |
| 5,317,711 | 5/1994 | Bourekas et al. | 395/425 |
| 5,375,228 | 12/1994 | Leary et al. | 395/183.09 |
| 5,418,452 | 5/1995 | Pyle | 395/158.1 |
| 5,473,754 | 12/1995 | Folwell et al. | 395/183.21 |
| 5,488,688 | 1/1996 | Gonzales et al. | 395/183.1 |

OTHER PUBLICATIONS

U.S. application No. 08/711,491 of Gregory L. Ranson, et al. filed Sep. 10, 1996 for: On–Chip Debug Support and Performance Monitoring in a Microprocessor.

*Primary Examiner*—Thomas M. Heckler

[57] ABSTRACT

Disclosed herein is sophisticated but low-cost debug hardware which may be used to identify the root cause of a functional or electrical problem in a microprocessor chip. The debug system comprises a raw mode trigger capability which allows microprocessor events to be generated either synchronously or asynchronously to a clock which steps an instruction pipeline. The debug system comprises one or more trigger means, one or more event generation means, and programmable means for alternately placing the one or more trigger means in synchronous or asynchronous mode. Each of the trigger means is implemented internally to a microprocessor so as to sample microprocessor signals and generate a number of triggers as programmed values of the microprocessor signals are detected. Each of the event generation means is also implemented internally to a microprocessor, and may be used to generate one or more microprocessor events in response to programmed combinations of the number of triggers generated by said trigger means. If desired, generation of a microprocessor event may be delayed until either 1) a programmed trigger combination has occurred a set number of times, or 2) a programmable countdown timer has expired.

20 Claims, 11 Drawing Sheets

FIG. 13

| DIAGNOSE REGISTER | DESCRIPTION |
|---|---|
| DR0 | IATO (INSTRUCTION ADDRESS TRIGGER OFFSET) |
| DR1 | IATOER (INSTRUCTION ADDRESS TRIGGER OFFSET ENABLE) |
| DR2 | IATSIR (INSTRUCTION ADDRESS TRIGGER SPACE ID) |
| DR3 | IATSIER (INSTRUCTION ADDRESS TRIGGER SPACE ID ENABLE) |
| DR4 | IATRPNR (INSTRUCTION ADDRESS TRIGGER RPN) |
| DR5 | IATRPNER (INSTRUCTION ADDRESS TRIGGER RPN ENABLE) |
| DR6 | DATOR (DATA ADDRESS TRIGGER OFFSET) |
| DR7 | DATOER (DATA ADDRESS TRIGGER OFFSET ENABLE) |
| DR8 | DATSIR (DATA ADDRESS TRIGGER SPACE ID) |
| DR9 | DATSIER (DATA ADDRESS TRIGGER SPACE ID ENABLE) |
| DR10 | ITR (INSTRUCTION TRIGGER) |
| DR11 | ITER (INSTRUCTION TRIGGER ENABLE) |
| DR12 | TP (ARBITRARY FUNCTION MINTERM SELECTOR) |
| DR13 | IC (ITERATION COUNTER) |
| DR14 | CT (COUNTDOWN TIMER) |
| DR15 | CR (DEBUG CONTROL) |
| DR16 | TR (TRIGGER CONTROL) |
| DR17 | HBTTR (HBT TEMPORARY REGISTER) |

| BIT | NAME | DESCRIPTION |
|---|---|---|
| 0 | DTENABLEH | ENABLES TRIGGER REGISTERS |
| 1 | HBTEH | HBT EVENT ENABLE ON TRIGGER MATCH |
| 2 | SOFEH | SOF EVENT ENABLE ON TRIGGER MATCH |
| 3 | EPEH | EP EVENT ENABLE ON TRIGGER MATCH |
| 4 | HBTIH | HBT EVENT INDICATOR BIT: A REQUESTED HBT EVENT HAS OCCURRED |
| 5 | SOFIH | SOF EVENT INDICATOR BIT: A REQUESTED SOF EVENT HAS OCCURRED |
| 6 | EPIH | EP EVENT INDICATOR BIT: A REQUESTED EP EVENT HAS OCCURRED |
| 7:31 | | <UNUSED> MAY BE USED FOR OTHER DEBUG FEATURES |

FIG. 14

| BIT | NAME | DESCRIPTION |
|---|---|---|
| 0 | IA_PIPED | ENABLE SYNCHRONOUS / ASYNCHRONOUS IA SAMPLING |
| 1 | IA_NULLIFY | NULLIFY SAMPLING OF IA VALIDITY SIGNALS |
| 2 | IA_VIRTUAL | ENABLE VIRTUAL IA SAMPLING |
| 3 | DA_PIPED | ENABLE SYNCHRONOUS / ASYNCHRONOUS DA SAMPLING |
| 4 | DA_NULLIFY | NULLIFY SAMPLING OF DA VALIDITY SIGNALS |
| 5 | DA_VIRTUAL | ENABLE VIRTUAL DA SAMPLING |
| 6 | ID_PIPED | ENABLE SYNCHRONOUS / ASYNCHRONOUS INSTRUCTION SAMPLING |
| 7 | ID_NULLIFY | NULLIFY SAMPLING OF INSTRUCTION VALIDITY SIGNALS |
| 8:31 | | <UNUSED> MAY BE USED FOR OTHER DEBUG FEATURES |

FIG. 15

DEBUG SYSTEM WITH RAW MODE TRIGGER CAPABILITY

FIELD OF THE INVENTION

This invention pertains to the testing and debug of a microprocessor, and more particularly, to an on-chip system and method of triggering events synchronously or asynchronously to a microprocessor's instruction pipeline.

BACKGROUND OF THE INVENTION

In recent years, it has become very difficult to diagnose failures in, and to measure the performance of, state-of-the-art microprocessors. This is because modern microprocessors not only run at very high clock speeds, but may also execute instructions in parallel, out of program order, and speculatively. Moreover, visibility of a microprocessor's inner state has become increasingly limited due to 1) the complexity of microprocessors (i.e., greater functionality), and 2) practical constraints on the number of externally available contact pads that can be provided on a chip package.

In the past, traditional failure diagnosis and performance measurement tools have been external logic analyzers and in-circuit emulators. Logic analyzers are capable of 1) monitoring signals on external contact pads and/or signals which are otherwise externally accessible, 2) capturing the state of these signals, and 3) generating triggers in response to the captured signal states. However, since logic analyzers rely solely on externally available signals, they cannot analyze and/or trigger on signals which are entirely internal to a chip (i.e., signals that do not make it to the "top", or surface, of a chip). In-circuit emulators, on the other hand, may be used to mimic the functionality of a microprocessor and add visibility to the microprocessor's internal state and signals—but again there are disadvantages to such a tool. Since an in-circuit emulator only emulates a microprocessor's functionality, it cannot give an entirely accurate representation of how a silicon embodiment of a microprocessor will perform. As a result, emulators are more useful for debugging system software than system hardware (such as a microprocessor).

A need therefore exists for a comprehensive system and method for enabling microprocessor and system designers to debug state-of-the-art microprocessors and systems more easily. More specifically, there exists a need for an on-chip system and method of generating microprocessor events either synchronously or asynchronously (i.e., from raw, unconsumed data) to an instruction pipeline.

It is therefore a primary object of this invention to provide a system and method which enables the debug of a microprocessor, wherein the system and method are implemented internally to a silicon embodiment of a microprocessor.

Another primary object of this invention is to provide an on-chip debug system and method which allows a user to program a variety of on-chip hardware triggers, which when programmed, allow a user to generate microprocessor events either synchronously or asynchronously to an instruction pipeline.

Yet another object of this invention is to provide an on-chip debug system and method which provides for a great amount of debug flexibility and functionality, yet does so with a simple and cost-effective implementation.

A system and method which fulfills the above objects will provide greater visibility of a chip's internal state, yet not interfere with the normal operation of a silicon device (i.e., test and debug will occur under actual system environment conditions, and while a microprocessor is running "at speed").

SUMMARY OF THE INVENTION

In the achievement of the foregoing objects, the inventors have devised sophisticated but low-cost debug hardware which may be used to identify the root cause of a functional or electrical problem in a microprocessor chip. One or more microprocessor events may be generated either synchronously or asynchronously to an instruction pipeline, and in response to programmed combinations of internal signal triggers. If desired, the events may be delayed through one or more occurrences of a programmed trigger combination via use of an iteration counter, or for a programmed amount of time via a countdown timer. After an event has been generated, various internal signal values may be scanned out of the microprocessor, and/or the microprocessor may be forced to alter its normal operation.

These and other important advantages and objectives of the present invention will be further explained in, or will become apparent from, the accompanying description, drawings and claims.

BRIEF DESCRIPTION OF THE DRAWINGS

An illustrative and presently preferred embodiment of the invention is illustrated in the drawings in which:

FIG. 13 illustrates (in summary form) diagnose registers used in the system and methods of FIGS. 2–12;

FIG. 14 illustrates exemplary bits of the FIG. 13 debug control register; and

FIG. 15 illustrates exemplary bits of the FIG. 13 trigger control register.

DESCRIPTION OF THE PREFERRED EMBODIMENT

Figure 1:
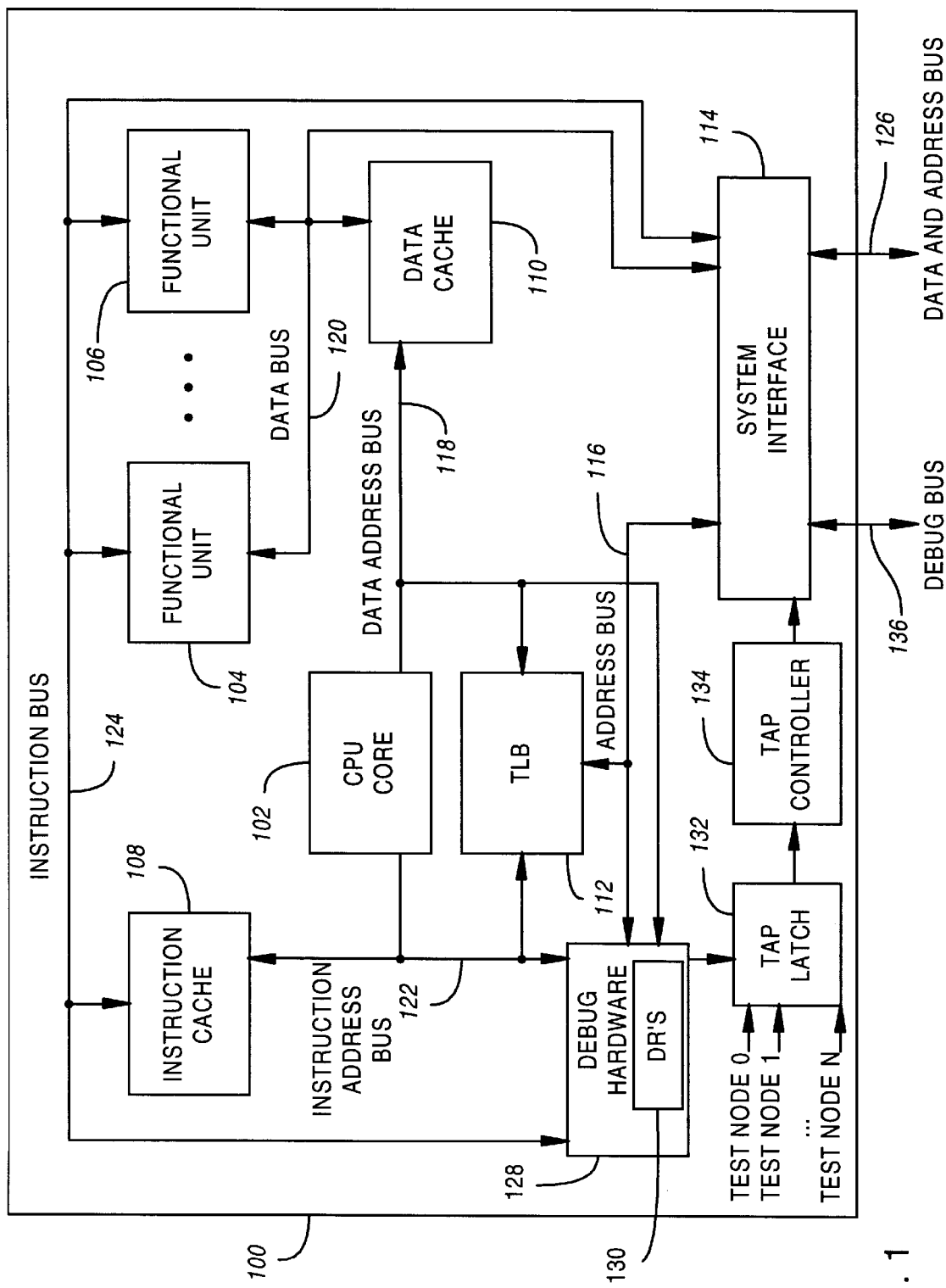
FIG. 1 illustrates an exemplary host processor for on-chip debug hardware capable of generating synchronous or asynchronous triggers.

Apparatus 128 for synchronously and/or asynchronously generating events 214, 216 within a microprocessor 100 is pictured in FIGS. 1–8. The apparatus 128 may generally comprise one or more trigger means 222–226, one or more event generation means 208–212, and programmable means 320, 420, 520 for alternately placing the one or more trigger means 222–226 in synchronous or asynchronous mode. Each of the trigger means 222–226 is implemented internally to the microprocessor 100 so as to sample microprocessor signals 118, 122, 124 and generate a number of triggers 202–206 as programmed values of the microprocessor signals 118, 122, 124 are detected. Each of the event generation means 208–212 is also implemented internally to the microprocessor 100, and may be used to generate one or more microprocessor events 214, 216 in response to programmed combinations of the number of triggers 202–206 generated by said trigger means 222–226. When the apparatus 128 is placed in synchronous mode, microprocessor signals 118, 122, 124 are sampled synchronously with a clock which steps an instruction pipeline. Otherwise, microprocessor signals 118, 122, 124 are sampled asynchronously to a clock or clocks which steps an instruction pipeline.

In conformance with the above-described apparatus 128, a method of synchronously and/or asynchronously generating events within a microprocessor 100 may comprise the steps of sampling signals 118, 122, 124 internal to the microprocessor 100, generating a number of triggers 202–206 as programmed values of the internal signals 118, 122, 124 are detected within the microprocessor 100, generating one or more microprocessor events 214, 216 in response to programmed combinations of the number of triggers 202–206 generated, and alternately placing one or more trigger means 222–226 internal to the microprocessor 100 in either synchronous or asynchronous mode.

Having described a debug system with raw mode trigger capability in general, the system will now be described in further detail.

The debug system with raw mode trigger capabililty described herein is implemented internally to a microprocessor chip. An exemplary host microprocessor 100 for such a debug system is therefore illustrated in FIG. 1 of the drawings. The host processor 100 is based on Hewlett-Packard's PA-7300LC microprocessor architecture, and may comprise a CPU (central processing unit) core 102; one or more functional units 104, 106 such as a floating point processor, integer unit, or the like; an instruction cache 108; a data cache 110; a shared data/instruction translation lookahead buffer (TLB) 112; and a system interface 114. In such a processor 100, an address bus 116 might connect the TLB 112 to the system interface 114; a data address bus 118 might connect the CPU core 102 to both the TLB 112 and data cache 110; a data bus 120 might connect the data cache 110 to one or more of the functional units 104, 106, and to the system interface 114; an instruction address bus 122 might connect the CPU core 102 to the instruction cache 108; and an instruction bus 124 might connect the instruction cache 108 to one or more of the functional units 104, 106, and to the system interface 114. Although each of the buses in FIG. 1 is represented as a single line, each may in fact comprise a plurality of bus lines.

In the microprocessor 100 described above, the processor's internal caches 108, 110 provide instructions and operands to the processor's one or more functional units 104, 106, until at some point, a cache miss is indicated. After a cache miss, a memory address corresponding to a missing instruction or operand is provided to external memory via the processor's system interface 114 and an external address bus 126. External memory may comprise additional caches and/or a main memory (not shown). If the processor's TLB 112 indicates a hit (i.e., match) with an address returned from external memory, external memory either provides an instruction corresponding to the memory address to the processor's instruction cache 108, or provides an operand corresponding to the memory address to the processor's data cache 110. As is conventional in most modern computer systems, the TLB 112 may support virtual addressing.

In a microprocessor 100 wherein instruction and data caches 108, 110 are implemented "on-chip", and the processor 100 comprises a great amount of functionality, it is difficult to debug both the processor 100, and software running on the processor 100. While logic analyzers, data capture boards, oscilloscopes, and the like may monitor signals which propagate to the top (i.e., an external contact pad) of the microprocessor's chip, many of the FIG. 1 processor's signals do not propagate to the "top". For example, signals carried on the processor's instruction and data address buses 122, 118 never propagate to a contact pad. Due to the premium placed on a chip's contact pads, it is impossible to dedicate a large number of pads for making the signals carried on wide, internal buses 118, 122 available to external debug equipment. While it is possible to share contact pads, thereby making additional internal signals externally available, or dedicate a few pins for serially scanning large amounts of signal data out of a chip, these systems and methods tend to impact a processor's performance, and can therefore skew debug data. Furthermore, processors being developed today comprise so much functionality that pad sharing and large serial scans are becoming more and more difficult to implement.

To circumvent these problems (and others), the processor 100 of FIG. 1 may be provided with integral debug hardware 128. The integral debug hardware 128 may receive a variety of signals which 1) only exist internally to a processor chip, and 2) propagate to the top of a chip. However, in a preferred embodiment, the debug hardware 128 is designed to receive signals from a processor's instruction address bus 122, data address bus 118, address bus 116, and instruction bus 124. The debug hardware 128 is programmable, and may be programmed to trigger complex events in response to the state or states of the buses 116, 118, 122, 124 it monitors. Being programmable, the debug hardware 128 comprises a number of programmable diagnose registers (DR'S in FIGS. 1 & 13) 130 for holding trigger values, combinational trigger conditions, and various other debug data.

Due to the functionality built into the debug hardware 128, one may trigger debug events 214, 216 (FIG. 2) upon the occurrence of programmed trigger combinations, without having to first transmit data off-chip. However, at times it may still be desirable to make internal signals 118, 122 externally available. To this end, the debug hardware 128 may be provided with a means of latching data from test nodes to a TAP (test access port) latch 132, and subsequently, to a TAP controller 134 (e.g., a serial TAP controller conforming to IEEE Standard 1149.1 entitled "Test Access Port and Boundary Scan Architecture"—i.e., the JTAG standard). In this manner, a microprocessor's otherwise internal signals may be scanned out to external debug equipment via the processor's system interface 114 and a debug bus 136.

Figure 2:
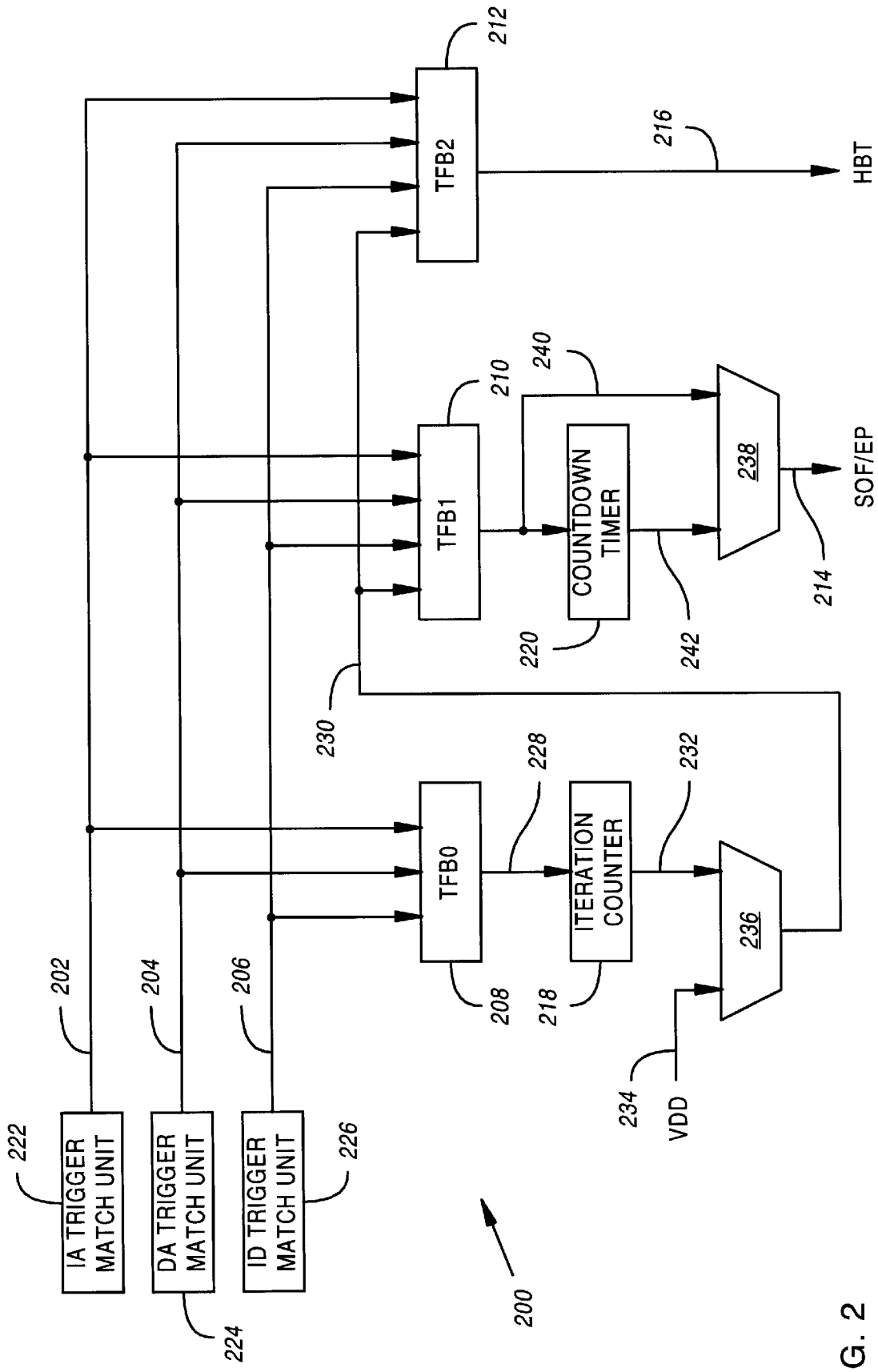
FIG. 2 illustrates details of the FIG. 1 debug hardware.

FIG. 2 provides an exemplary embodiment 200 of the FIG. 1 debug hardware 128, wherein a variety of triggers 202, 204, 206 are generated in response to signals carried over the FIG. 1 processor's instruction address bus 122, data address bus 118, address bus 116, and instruction bus 124. These triggers 202–206 may be provided to one or more trigger functional blocks (e.g., TFB0, TFB1, and TFB2 in the drawings) 208, 210, 212 for generating a number of events 214, 216 in response to programmed combinations of the triggers 202–206. The exemplary embodiment 200 of debug hardware 128 also provides for generating events 214, 216 in response to an iteration counter 218, and for generating an event 214 only after a countdown timer 220 has elapsed. Furthermore, triggers 202–206 and events 214, 216 may be generated either synchronously or asynchronously to an instruction pipeline.

Figure 5:
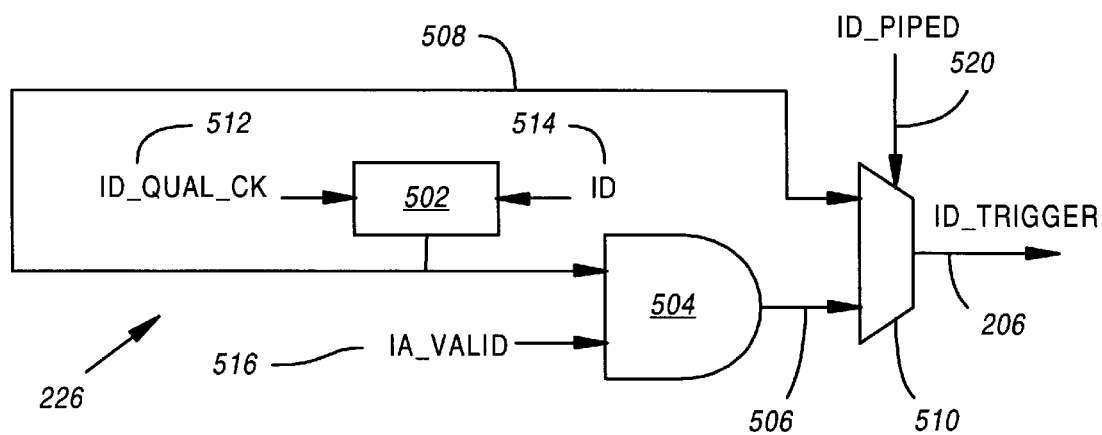
FIG. 5 illustrates means for generating either a synchronous or asynchronous instruction data trigger in response to the outputs of various signal comparison blocks.
Figure 6:
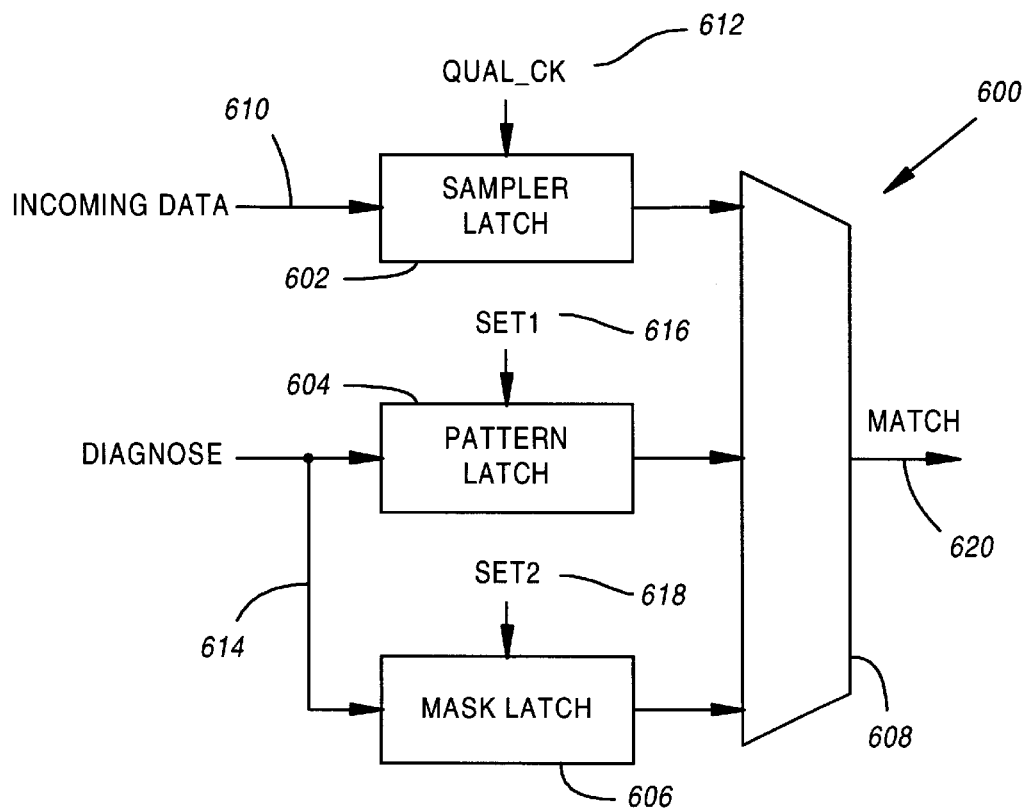
FIG. 6 illustrates components which might be used to implement any of the comparison blocks of FIGS. 3–5.

Each FIG. 2 trigger 202–206 is generated by a trigger match unit 222–226, which samples the lines of a particular bus 116, 118, 122, 124 and compares the sampled bus lines with one or more bits of a programmed diagnose register 604, 606 (FIG. 6). Components of the FIG. 2 trigger match units 222–226 are illustrated in more detail in FIGS. 3–6.

Figure 3:
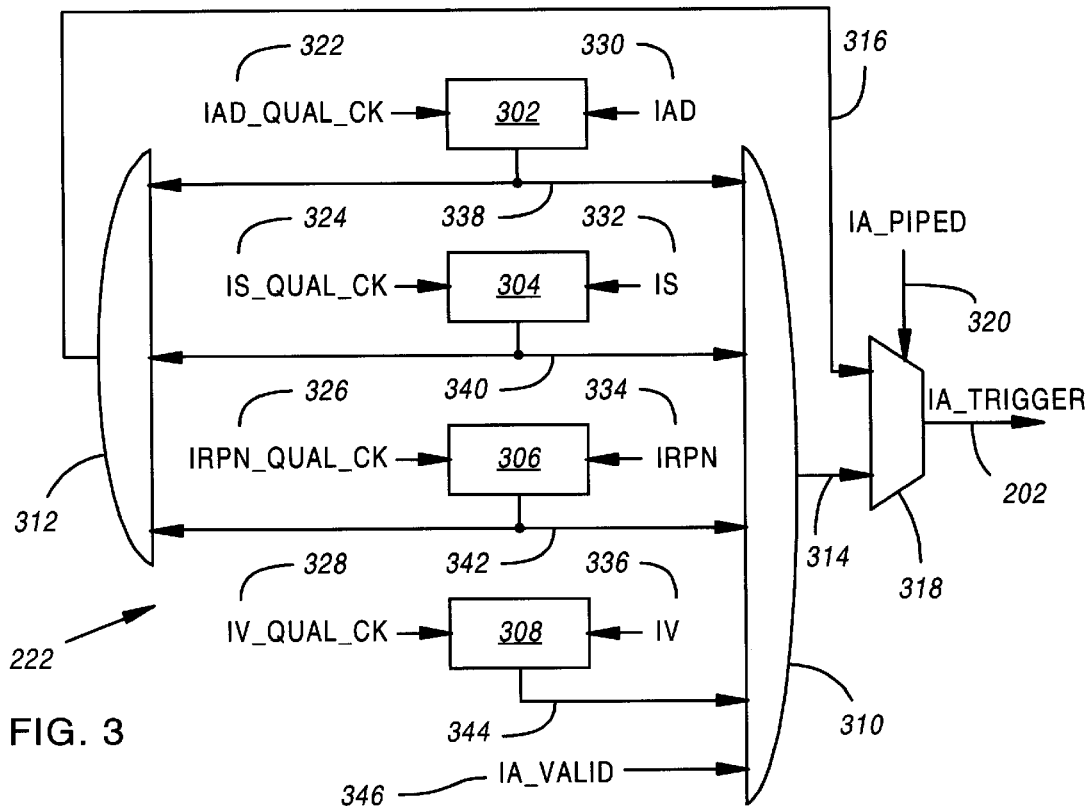
FIG. 3 illustrates means for generating either a synchronous or asynchronous instruction address trigger in response to the outputs of various signal comparison blocks.

A trigger match unit 222 which samples the lines of a processor's instruction address bus 122 is shown in FIG. 3. The instruction address (IA) trigger match unit 222 comprises four comparison blocks 302–308 and an AND gate (310 or 312). Preferably, the IA trigger match unit 222 also comprises a second AND gate (312 or 310). In this manner, the first AND gate 310 may be used to determine whether an instruction address corresponding to an instruction consumed by one of a processor's functional units 104, 106 matches programmed trigger values, and the second AND gate 312 may be used to determine whether an instruction address corresponding to an instruction address which merely appears on the IA bus 122 (i.e., raw data) matches programmed trigger values. Debug hardware 128 may therefore be programmed to operate in synchronous or asynchronous mode, depending on how matches are determined with respect to a pipe clock (i.e., a clock which triggers the consumption of instructions in an instruction pipeline). If an IA trigger match unit 222 is provided with means for generating synchronous and asynchronous IA match signals 314, 316, a multiplexer 318 may be programmed to select one of the match signals 314, 316 based on a select signal 320 (IA_PIPED) indicative of whether debug hardware 128 is running in synchronous or asynchronous mode.

The first three comparison blocks 302–306 of FIG. 3 serve to compare various components of a sampled instruction address with programmed IA values (see DR0–DR5 in FIG. 13). In the exemplary host processor 100 of FIG. 1 (i.e., Hewlett-Packard's PA-7300LC microprocessor), an instruction address comprises three components: instruction address (IAD), instruction space (IS), and instruction real page number (IRPN). While the IAD and IS components are obtained from the instruction address bus 122, the IRPN component is obtained from the address bus 116. Matches 338–342 of these three components must therefore be ANDed together to determine whether an IA match 316 exists. This disclosure anticipates that various microprocessor architectures might be configured differently, and that the number and type of elements of an instruction or data address which need to be compared to determine a match might therefore differ.

The fourth comparison block 308 of the IA trigger match unit 222 may be used to determine whether a virtual instruction address match exists.

When the IA trigger match unit 222 is operating in asynchronous mode, an IA trigger 202 is generated if all of the components of an instruction address (i.e., IAD, IS and IRPN) match programmed values. However, in synchronous mode, one may also be concerned that other values match and/or are true. A first match 344 of concern may be the virtual address match noted above. A second match or matches 346 of concern pertain to the validity of an instruction address. In a processor 100 such as the HP PA-7300LC, which may abandon or choose not to execute an instruction which has been fetched and/or pipelined (i.e., is in line to be executed), it is likely that validity signals will be generated as an instruction passes through various stages of an instruction pipeline. In order to insure that debug hardware 128 truly operates in a synchronous mode, these validity signals (whose values are represented collectively in FIG. 3 as IA_VALID 346) should be ANDed with instruction address match signals 338–342. As some validity signals may be generated very late in a pipeline, assessment of these late validity signals may be handled by software upon the generation of a specified debug event 214, 216. Should a user only be concerned with sampling an instruction in sync with an instruction pipeline, validity signals may be collectively or individually ANDed with a NULLIFY signal (IA_NULLIFY), wherein if the NULLIFY signal is false, validity signals may be ignored in the generation of an IA trigger 202.

Figure 4:
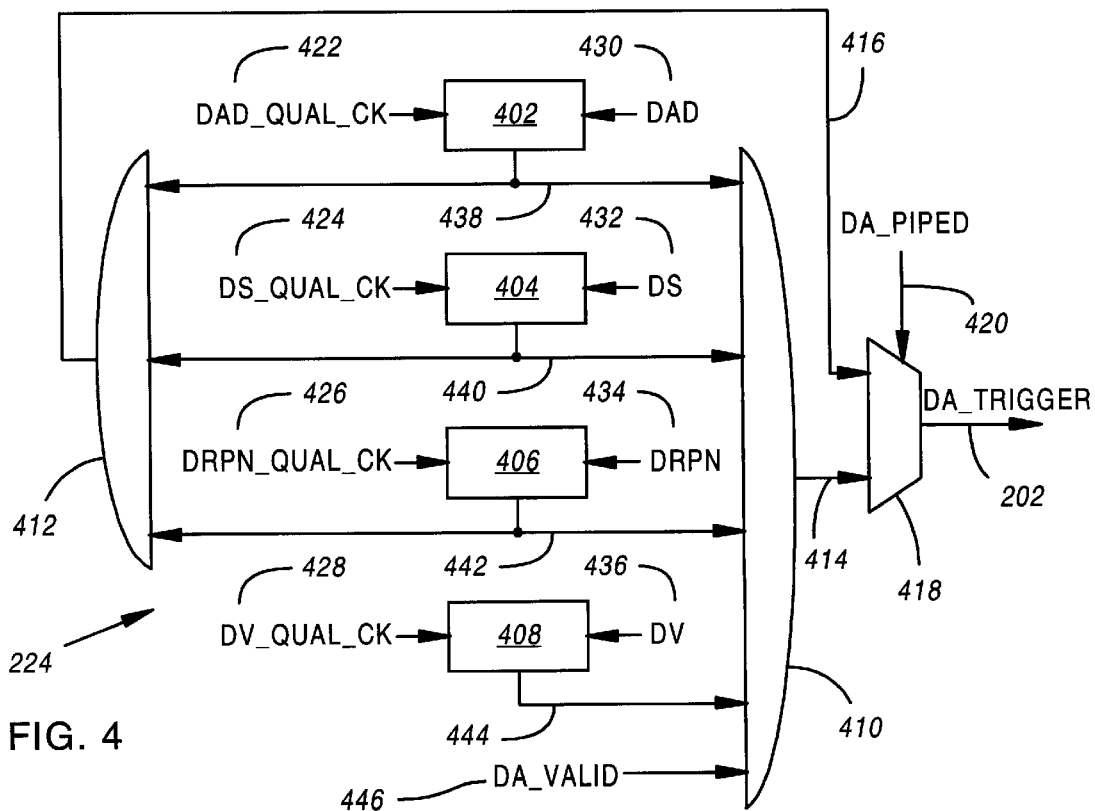
FIG. 4 illustrates means for generating either a synchronous or asynchronous data address trigger in response to the outputs of various signal comparison blocks.

A trigger match unit 224 which samples the lines of a processor's data address bus 118 is shown in FIG. 4. The data address (DA) trigger match unit 224 comprises four comparison blocks 402–408, two AND gates 410, 412, and a multiplexor 418. Similarly to the IA trigger match unit 222, a control signal 420 (DA_PIPED) is used to select either synchronous 414 or asynchronous 416 match data to output as a DA trigger 204.

The first three comparison blocks 402–406 of the DA trigger match unit 224 serve to compare various components of a sampled data address with programmed DA values. In the exemplary host processor 100 of FIG. 1, a data address comprises three components: data address (DAD), data space (DS), and data real page number (DRPN). Both DAD and DS are sampled from the data address bus 118, while DRPN is sampled from the address bus 116. Matches 438–442 of these three components must therefore be ANDed together to determine whether a DA match 416 exists. The fourth comparison block 408 of the DA trigger match unit 224 is again used to determine whether a virtual data address match exists.

Note that since all of the signals sampled during trigger generation may not appear on their respective buses 116, 118, 122, 124 at a single given instance, some signals may have to be sampled and latched while other signals remain to be generated. However, some signals are difficult or even impossible to sample due to their late generation. In the HP PA-7300LC microprocessor 100, this is the case with the DRPN component of a data address. As a result, the HP PA-7300LC debug hardware 128 does not provide a means of sampling a DRPN, and its DA trigger match unit 224 only comprises three comparison blocks 402, 404, 408. However, a DRPN may be later sampled and analyzed in response to software controls.

In asynchronous mode, a DA trigger 204 (or trigger match signal) is generated if all of the components of a data address (i.e., DAD, DS and DRPN) match programmed values. However, in synchronous mode, one may also match a virtual address and/or DA validity signals (collectively noted as DA_VALID 346).

A trigger match unit 226 which samples the lines of a processor's instruction (ID) bus 124 is shown in FIG. 5. The trigger match unit 226 comprises only a single comparison block 502, an AND gate 504, and a multiplexor 510, wherein the multiplexor 510 again uses a programmed signal 520 (ID_PIPED) to select between synchronous 506 and asynchronous 508 match data. A synchronous ID match 506 only differs from an asynchronous ID match 508 in that a synchronous ID match 506 takes into account the status of ID validity signals (ID_VALID 516) and is generated synchronous to an instruction pipeline. Although the ID trigger match unit 226 is similar to the previously described IA and DA trigger match units 222, 224, note that instruction data will typically only comprise a single piece of comparison information. However, in a processor 100 that comprises a plurality of instruction buses, an ID trigger match unit 226 could comprise various comparison blocks for matching an instruction or instructions on one or more of the processor's instruction buses.

Each of the comparison blocks 302–306, 402–406, 502 of FIGS. 3–5 (but for virtual address comparison blocks 308, 408, which merely latch and process a single bit of information (IV 336, DV 436) in response to a qualified clock signal (IV_QUAL_CK 328, DV_QUAL_CK 428)) may be similarly constructed. FIG. 6 therefore illustrates an exemplary configuration 600 of a comparison block. The comparison block comprises a bitwise sample latch 602, one or more bitwise programmable latches 604, 606, and a comparator 608. The sample latch 602 of a comparison block receives incoming data 610 (e.g., IAD 330, IS 332, IRPN 334, DAD 430, DS 432, DRPN 434, or ID 514 in FIGS. 3–5) in sync with a qualified clock signal 612 (e.g., IAD_QUAL_CK 322, IS_QUAL_CK 324, IRPN_QUAL_CK 326, DAD_QUAL_CK 422, DS_QUAL_CK 424, DRPN_QUAL_CK 426, or ID_QUAL_CK 512 in FIGS. 3–5). The qualified clock signal 612 will typically be a system or local clock ANDed with a qualifying signal (i.e., either a constant voltage or a pipe step). A pipe step is merely a clock which steps an instruction pipeline. A user may programmatically select the qualifying signal, thereby determining whether incoming data 610 is sampled synchronously or asynchronously to an instruction pipeline.

The one or more programmable latches of a comparison block 600 preferably comprise a bitwise pattern latch 604 and a bitwise mask latch 606. The pattern latch 604 may be used to store a programmed value which incoming data 610 must match, whereas the mask latch 606 may be used to store a programmed value which identifies those bits of incoming data 610 which need to be matched. In this manner, one may program a trigger condition in which some or all of the bits of a bus 116, 118, 122, 124 must be matched in order to generate a trigger 202, 204, 206. The programmable latches 604, 606 may be set via any one of a number of conventional methods. In FIG. 6, latch values are transmitted to the latches 604, 606 one at a time, and clocked into the latches 604, 606 with appropriate clocks (e.g., SET1 616 and SET2 618 in FIG. 6).

The comparator 608 of a comparison block 600 may be of conventional design, and compares incoming data 610 to the values stored in each of the programmable latches 604, 606. If all lines of incoming data 610 identified by the programmed mask value match corresponding lines of the programmed pattern value, a match signal 620 (e.g., 338–344, 438–444, or 508 in FIGS. 3–5) will be generated.

Figure 7:
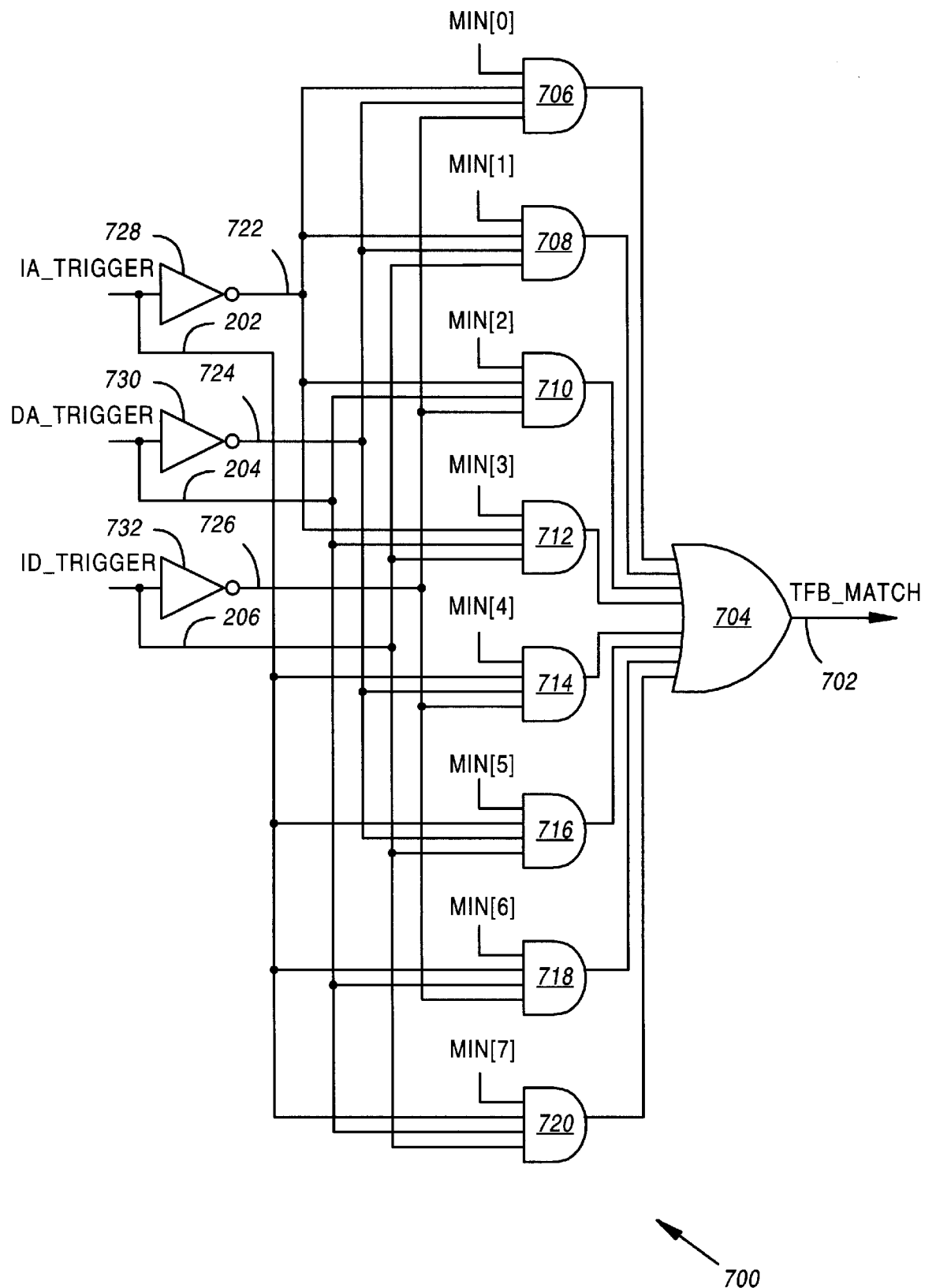
FIG. 7 illustrates a trigger functional block for generating an event signal in response to a programmed combination of system triggers.

In FIG. 2, a number of trigger functional blocks 208–212 are shown to receive each of the various triggers 202–206 generated by the trigger match units 222–226. In order to keep debug hardware 128 simple, each of the trigger functional blocks 208–212 (TFBs) may be programmed to generate a simple minterm (TFB_MATCH 702) of trigger values 202–206, as shown in greater detail in FIG. 7. FIG. 7 is illustrative of a single TFB 700, and comprises means for selecting a programmed minterm of three trigger inputs 202–206. As illustrated in the FIG. 7 TFB embodiment 700, a minterm of trigger values 202–206 may be defined as follows:

TFB_MATCH =
   MIN[0]·(~IA_TRIGGER)·(~DA_TRIGGER)·(~ID_TRIGGER) +
   MIN[1]·(~IA_TRIGGER)·(~DA_TRIGGER)·(ID_TRIGGER) +
   MIN[2]·(~IA_TRIGGER)·(DA_TRIGGER)·(~ID_TRIGGER) +
   MIN[3]·(~IA_TRIGGER)·(DA_TRIGGER)·(ID_TRIGGER) +
   MIN[4]·(IA_TRIGGER)·(~DA_TRIGGER)·(~ID_TRIGGER) +
   MIN[5]·(IA_TRIGGER)·(~DA_TRIGGER)·(ID_TRIGGER) +
   MIN[6]·(IA_TRIGGER)·(DA_TRIGGER)·(~ID_TRIGGER) +
   MIN[7]·(IA_TRIGGER)·(DA_TRIGGER)·(ID_TRIGGER), where "." indicates an ANDing function, and "+" indicates an ORing function.

An OR gate 704 may be used to monitor the outputs of the AND gates 706–720 which calculate the above minterm functions. A TFB_MATCH signal 702 is therefore generated whenever one of the above minterm functions is true. Note that each AND gate 706–720, in addition to receiving a combination of trigger inputs 202–206, 722–726, also receives a minterm enable signal (e.g., MIN[0] . . . MIN[7]). In programming debug hardware 128, one may therefore enable one or more minterms while disabling others. The only additional components needed to complete a TFB 700 are inverters 728–732 for generating the inverses of triggers 722–726.

While each FIG. 2 TFB 208–212 can be programmed to calculate a different minterm of the triggers 202–206, and a number of event signals 214, 216 can be generated from these simple minterm calculations, it might also be desirable to make certain events 214, 216 responsive to an iteration counter 218 and/or countdown timer 220. Note that the preferred embodiment 200 of debug hardware 128 illustrated in FIG. 2 generates a HBT event 216 in response to an iteration counter 218, and generates an SOF (sample on the fly) or EP (electronic pulse) event 214 in response to both an iteration counter 218 and countdown timer 220. An SOF/EP event 214 can be used to 1) latch the state of various nodes internal to a microprocessor 100, and 2) signal external test equipment that the latched data is available to be scanned out from a microprocessor 100 (as is more fully described in the U.S. patent application of Tobin et al. filed Nov. 14, 1996 and entitled "A Test System for Obtaining a Sample-On-The-Fly Event Trace for an Integrated Circuit with an Integrated Debug Trigger Apparatus and an External Pulse Pin", which is hereby incorporated by reference for all that it discloses).

Figure 8:
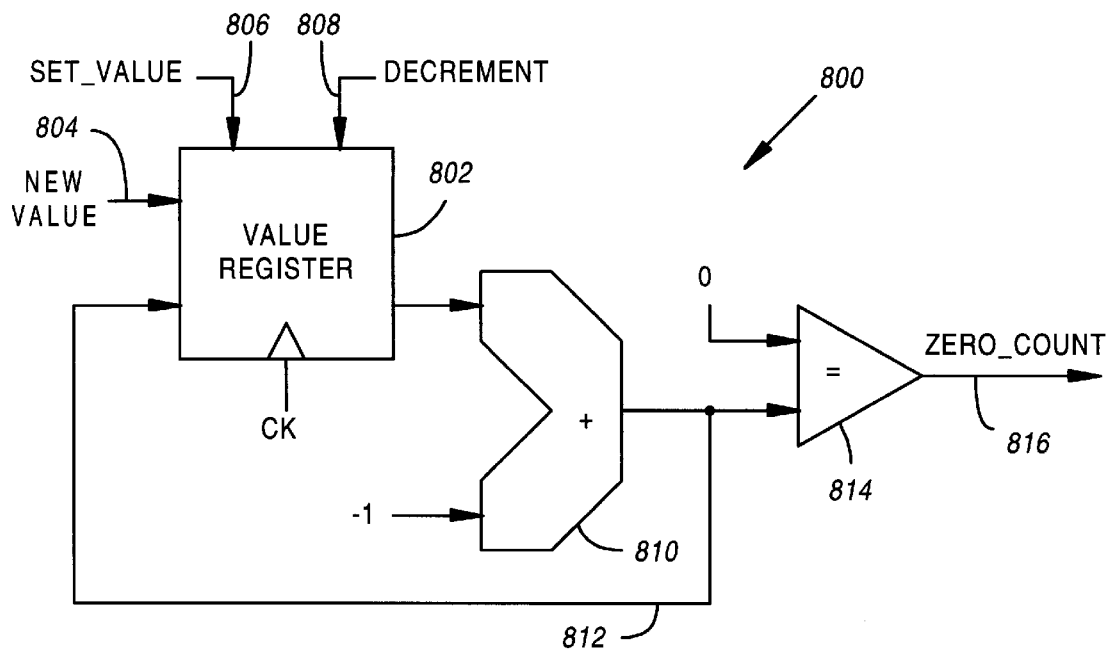
FIG. 8 illustrates a preferred means of implementing either the iteration counter and/or the countdown timer of FIG. 2.

Both the iteration counter 218 and countdown timer 220 may be implemented in a similar fashion, as demonstrated in FIG. 8. The apparatus 800 of FIG. 8 comprises a value register 802 which may be programmed by clocking a NEW VALUE 804 into the register 800 in response to a SET_VALUE clock 806. The register also receives a DECREMENT signal 808—the derivation of which will be described shortly. In response to a positive DECREMENT signal 808, a "−1" will be added to the output of the value register 802 (e.g., via an adder 810). The output 812 of the adder 810 is then fed back into the value register 802 as the register's current value, and is simultaneously fed into a comparator 814 for comparison with a "0" count. If the output 812 of the adder 810 is "0", then a ZERO_COUNT indication 816 is generated.

In implementing an iteration counter 218, the DECREMENT signal 808 is merely the direct output 228 of a TFB (e.g., TFB0 208). In this manner, every time a given combination (i.e., sum of minterms) of trigger signals 202–206 occurs, the iteration counter 218 is decremented by one.

In implementing a countdown timer 220, the DECREMENT signal 808 is held low until TFB1 210 indicates the occurrence of a programmed combination of triggers 202–206. The DECREMENT signal 808 is then held high, regardless of the output of TFB1 210, until the current value of the value register 802 is zero.

In the preferred embodiment 200 of debug hardware 128 illustrated in FIG. 2, the ZERO_COUNT 816 generated by the iteration counter 218 serves as an enabling input 230 to both TFB1 210 and TFB2 212 (e.g., the enable signal 230 may be ANDed into each minterm function 706–720, or ANDed with the output 702 of a TFB 210, 212). For further flexibility of debug parameters, the iteration counter 218 may be enabled or disabled by multiplexing its output 232 with an always true signal 234 (e.g., VDD), and then programming its select line(s).

The ZERO_COUNT 816 generated by the countdown timer 220 of FIG. 2 can be used to delay the generation of an SOF/EP event 214. Again, it may be desirable to offer a means of enabling or disabling the countdown timer 220. This can be achieved by programming the select line(s) of the multiplexor 238, wherein a first input to the multiplexor 238 is derived from the direct output 240 of TFB1 210, and a second input is derived from the output 242 of the countdown timer 220.

As previously stated, the above described debug hardware 128 may be used to in turn generate programmed events, one of which is a hardware breakpoint trap (HBT) 216. Generation of a HBT 216 is dependent upon 1) enabling debug hardware 128, 2) programming pattern 604 and mask 606 registers, trigger functional blocks 208, 212, and an optional iteration counter 218, 3) generating triggers, and 4) if an optional iteration counter 218 is programmed, generating a HBT enable signal 230. Unlike passive SOF/EP events 214 (where internal node values are merely preserved, and a microprocessor 100 continues with its normal operation), a HBT 216 actually interrupts 902 (FIG. 9) the normal operation of a microprocessor and alters program flow.

Figure 9:
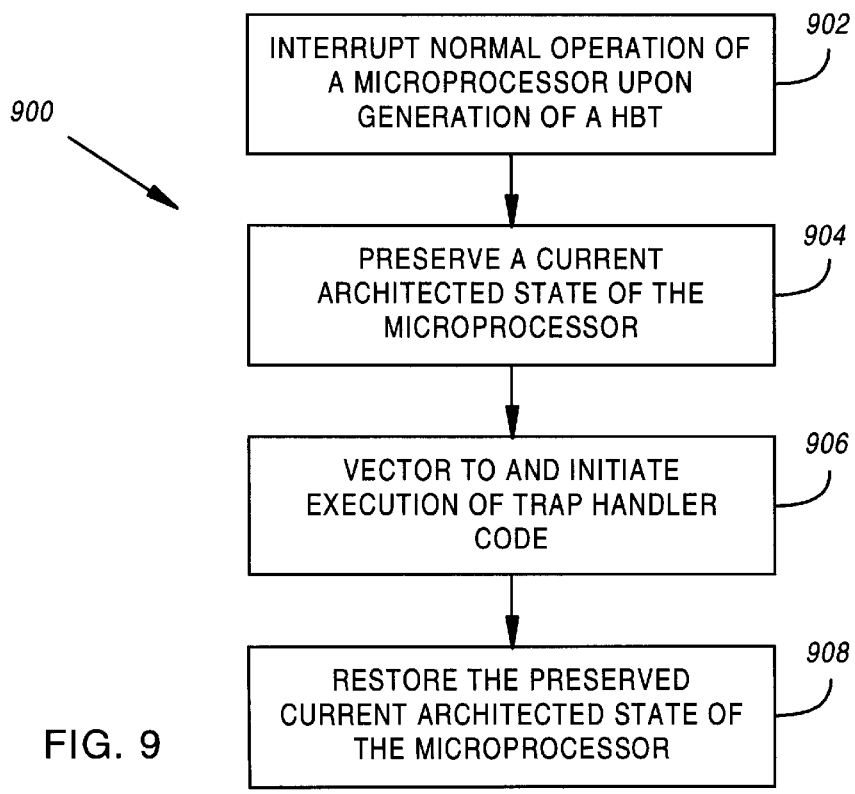
FIG. 9 illustrates a sequence of events which may be programmed to occur upon generation of a HBT event.
Figure 10:
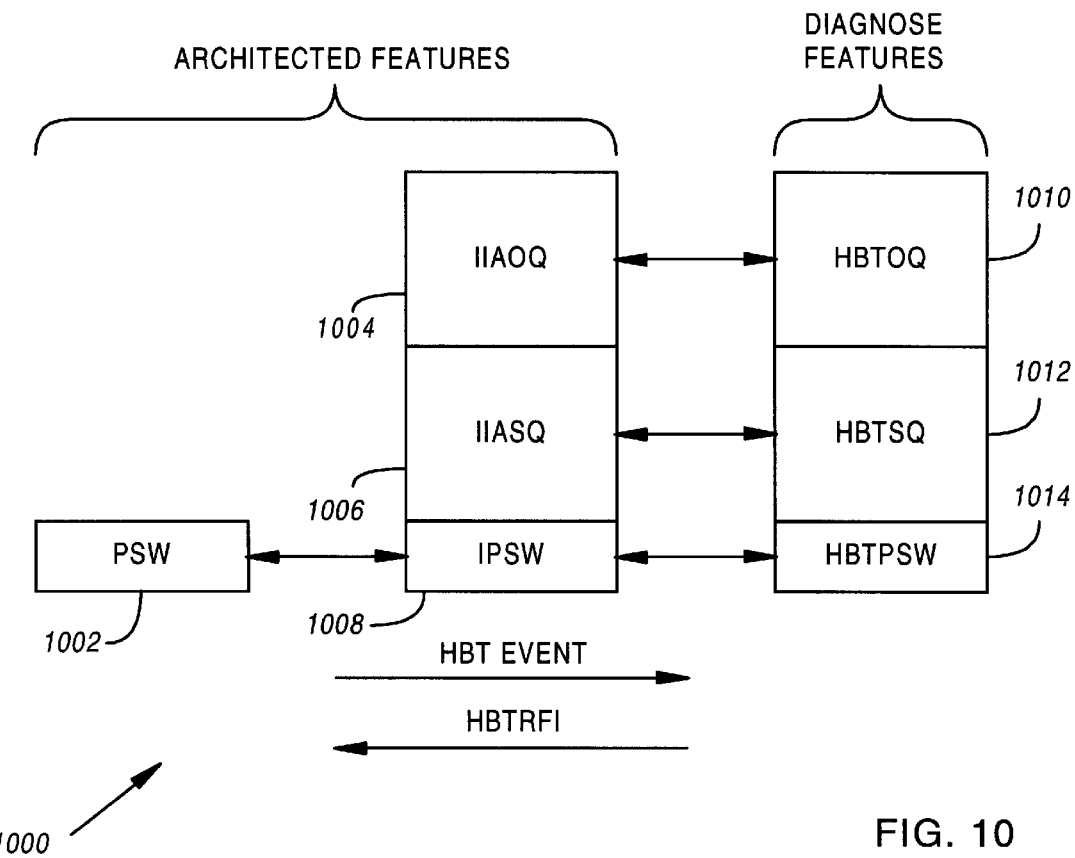
FIG. 10 illustrates architected and diagnostic registers and queues used by the methods of FIGS. 9, 11 and 12.
Figure 11:
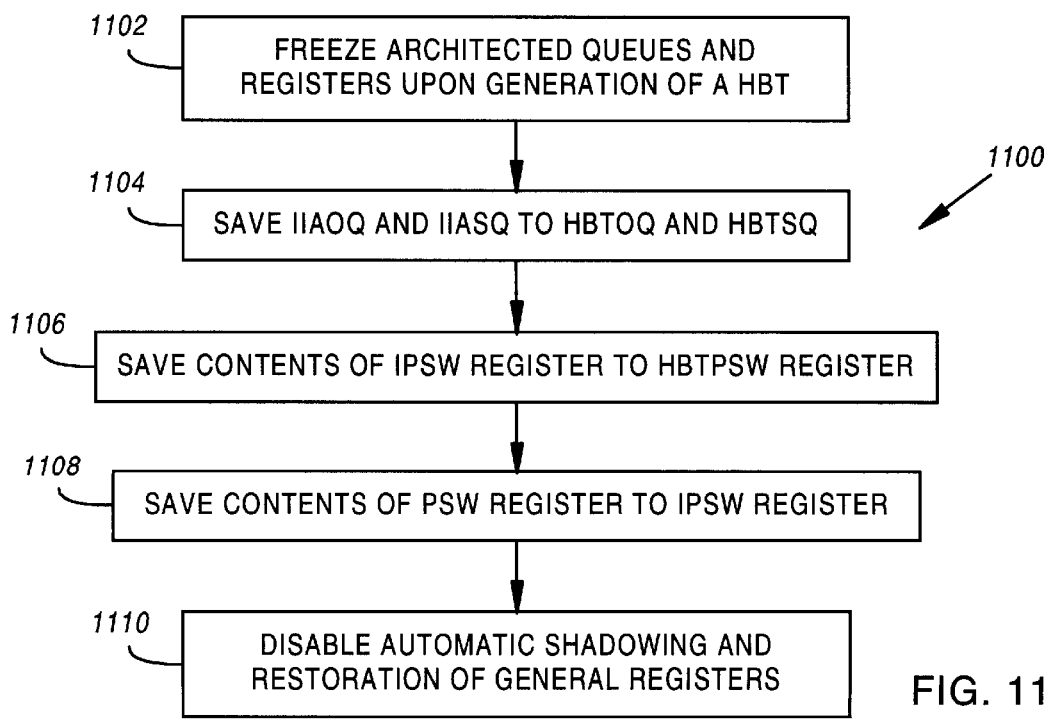
FIG. 11 illustrates a method of preserving a microprocessor's state upon generation of a HBT event.

Upon generation of a HBT 216, architected queues and registers freeze 1102 (FIG. 11) while hardware waits for an instruction to trap. After the instruction traps, the current architected state of a microprocessor 100 is preserved 904 (FIG. 9). This is accomplished by copying 1104, 1106 the current values of one or more architected registers 1004–1008 to one or more dedicated HBT backup registers 1010–1014, as shown in FIG. 10. The architected registers 1004–1008 to be backed up must include an interrupt processor status word (IPSW 1008—i.e., the backup copy of a processor status word (PSW) 1002) made during an interruption) and one or more interrupt instruction address queues 1004, 1006 (IIAQs—which were frozen when an interruption occured, and are only unfrozen when a special form return from interrupt instruction is executed). In the HP PA-7300LC, IIAQs 1004, 1006 to be backed up comprise front and back IIA space queues (IIASQs 1006) and IIA offset queues (IIAOQs 1004). After backing up 1104, 1106 the IPSW 1008 and IIAQs 1004, 1006, the PSW 1006 is copied 1108 to the IPSW 1008. In this manner the PSW 1002, IPSW 1008, and IIAQs 1004, 1006 are freed for trap handler use, while the dedicated HBT backup registers 1010–1014 and all shadow registers are frozen (note that a HBT 216 therefore requires the disabling 1112 of automatic shadowing, unlike architected traps).

In order to preserve the architected state of a microprocessor, HBTs must take precedence over all other traps, including a high priority machine check (HPMC). HBTs therefore trap to a HPMC address. As a result, a HBT indicator bit (HBTIH) must be set after the above register contents have been preserved. In this manner, a HBT 216 may be distinguished from a true HPMC.

Figure 12:
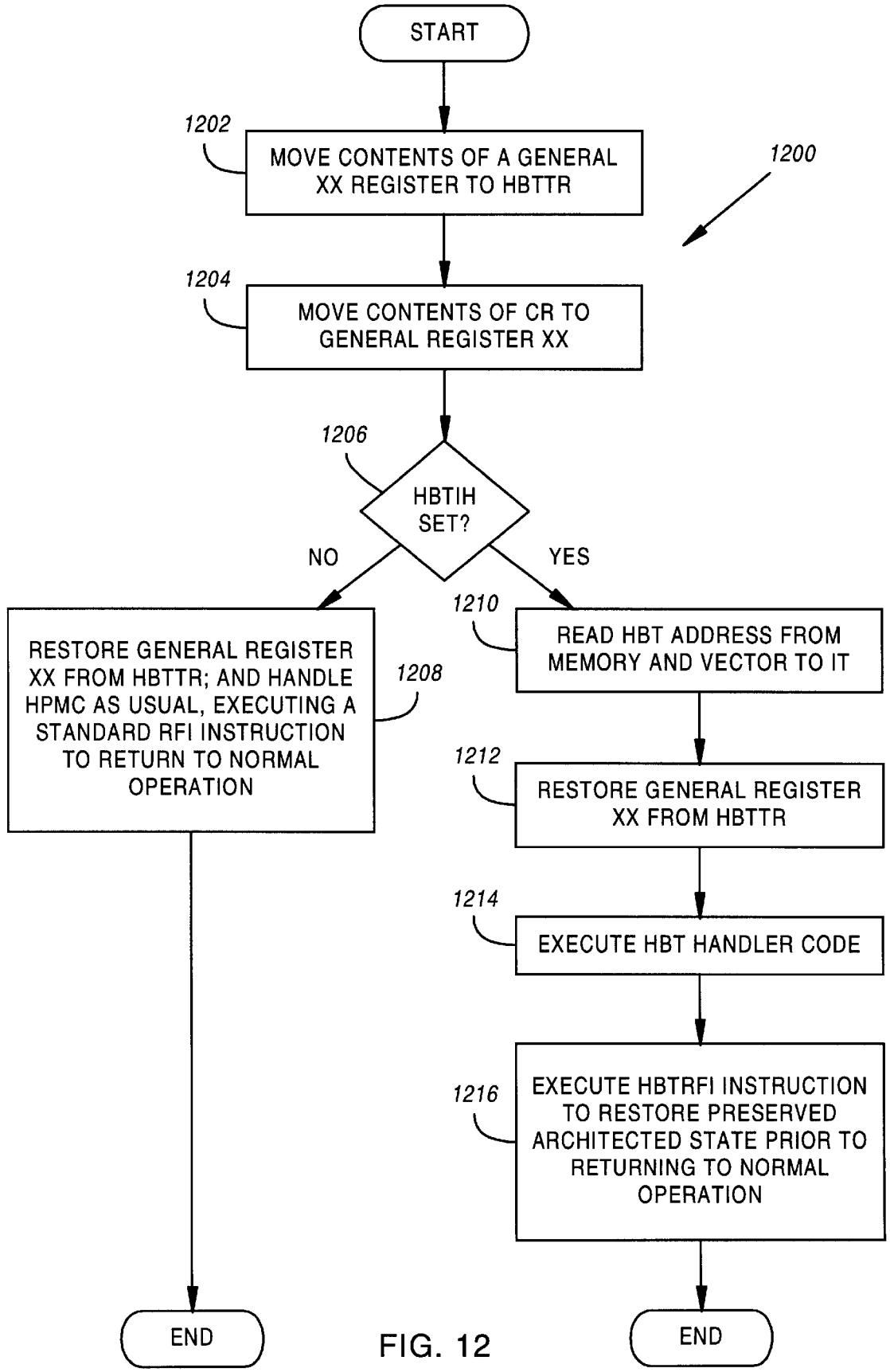
FIG. 12 illustrates a method of handling a HBT event within a HPMC trap handler.

After preserving 904 a microprocessor's architected state and setting a HBT indicator bit, debug software may vector program control to trap handler code as shown in FIG. 12. However, since a HBT 216 takes priority over all other traps, HBT handler code is vectored to by way of a microprocessor's HPMC handler.

In the HPMC handler, processor dependent code (PDC—i.e., code stored in ROM and called by a microprocessor's operating system) first checks HBTIH to determine whether it is handling a HBT 216 or true HPMC. If HBTIH is set, the HPMC handler reads a HBT address from memory and vectors to it. HP PA-7300LC PDC for accomplishing these tasks might appear as follows:

```
;; HPMC Address:   0xf0000000
        MTCPU17(gr8)
        MFCPU15(gr8)
        BB,>=,n    gr8,DR15_HBTIH,check_hpmc
        LDW        HBT_VECTOR(0,0), gr8
        BV         0(0,gr8)
check_hpmc
        MFCPU16(gr8)
        << Normal HPMC handler code >>
```

The first line of code (after the HPMC Address) moves 1202 (FIG. 12) the contents of a general architected register (e.g., gr8) to a HBT scratch register (e.g., DR17 or HBTTR). The second line of code moves 1204 the contents of a HBT control register (e.g., DR15 or CR) comprising HBTIH to the backed up architected register. The value of HBTIH is then polled 1206. If HBTIH is set, the HPMC handler retrieves the address of HBT handler code and vectors to it 1210. Otherwise the HPMC handler restores the value of the backed up general register, and handles a HPMC as usual 1208.

Note that HBT handler code must comprise a command for restoring 1212 the contents of the general register used to check HBTIH.

HBT's are generally triggered synchronous to an instruction pipeline, and will most likely be generated in response to a later pipeline stage. However, even though a HBT 216 may be generated in response to a later pipeline stage, it may not reflect nullification information which comes after the stage in which it is generated. These late validity signals may therefore be analyzed as HBT handler code is being executed 1214. Although this makes trap handler code slightly more complex, it decreases the size and amount of logic/hardware required to generate a HBT.

After HBT handler code has been executed, a special form return from interrupt instruction (HBTRFI) must be executed so as to restore the preserved current state of a microprocessor prior to returning to normal operation. In addition to restoring the PSW 1002 (as is done by a conventional RFI instruction), the HBTRFI also restores the IPSW 1008 and IIAQs 1004, 1006 from the HBT dedicated backup registers 1010–1014.

Note that in returning to normal operation, an iteration counter 218 programmed to enable a HBT 216 upon the first occurrence of an instruction can result in a trap "loop", wherein a HBT 216 is immediately generated due to a restored "current state" which comprises all of the triggers 202–206 required to generate a HBT event 216. HBT handler code should therefore program the iteration counter 218 to step past the current HBT 216 (i.e., by setting the iteration counter to a count of two or more). HBT handler code should also clear HBTIH so that HBT handler code is not subsequently executed during a true HPMC.

An important feature of the above described HBT is an ability to generate a trap within a trap. Since the HBT 1) does not use an architected trap handler mechanism (but for using the HPMC handler to branch to HBT handler code), and 2) preserves the state of architected registers 1002–1008, a HBT may be generated from within an architected trap handler. This is very useful for debugging trap handler code.

FIG. 13 illustrates diagnose registers, referred to above, which are required to implement the above debug features. In order to minimize the registers' impact on chip area, it may be preferable to divide them into page 0 and page 1 diagnose registers. Registers DR0, DR2, DR4, DR6, DR8 and DR10 are pattern registers, and registers DR1, DR3, DR5, DR7, DR9 and DR11 are mask registers. DR12 is a minterm select register, and may comprise twenty-four active bits, eight each for programming the minterm functions of TFB0 208, TFB1 210, and TFB2 212. DR13 and DR14 may each comprise one bit for enabling an iteration counter 218 or countdown timer 220, and thirty-one bits for programming the device's value. DR15 (also illustrated in FIG. 14) is the master debug configuration register. All of its bits are read/write, except for HBTIH, SOFIH, and EPIH which are read/clear. DTENABLEH is a master debug enable bit, which must be set before trigger registers are programmed. DR16 (also illustrated in FIG. 15) is a trigger control register for enabling various trigger features discussed herein (such as synchronous/asynchronous trigger generation). DR17 is a scratch register which may be used in checking HBTIH.

External hardware and software may be used to 1) program the aforementioned triggers and conditions, 2) receive trigger match and event data, and 3) interpret the trigger match and event data to debug a microprocessor 100. The external hardware may comprise data capture boards, logic analyzers, oscilloscopes, power supplies, pulse generators, and the like. External software may comprise programming aids for configuring debug triggers (preferably comprising a graphical user interface), and interpretation aids for printing trigger and event data and/or analyzing same.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. Apparatus for synchronously and/or asynchronously generating events within a microprocessor, the apparatus comprising:
   a) one or more trigger means, internal to the microprocessor, for sampling microprocessor signals and generating a number of triggers as programmed values of the microprocessor signals are detected;
   b) one or more event generation means, internal to the microprocessor, for generating microprocessor events in response to programmed combinations of the number of triggers generated by said trigger means; and
   c) programmable means for alternately placing the one or more trigger means in synchronous mode, wherein the sampling of microprocessor signals occurs synchronous to a clock which steps an instruction pipeline, or in asynchronous mode, wherein the sampling of microprocessor signals occurs asynchronous to a clock which steps an instruction pipeline.

2. Apparatus as in claim 1, wherein:
   a) each of the one or more trigger means samples microprocessor signals in response to one or more qualified clocks; and
   b) the programmable means for alternately placing the trigger means in synchronous or asynchronous mode comprises a number of programmable signals, wherein the programmable signals:
      i) are received by said one or more trigger means;
      ii) determine the qualification of the one or more qualified clocks; and
      iii) determine which programmed values of microprocessor signals must be detected in order to generate the number of triggers.

3. Apparatus as in claim 1, wherein each of the one or more trigger means comprises:
   a) one or more comparison blocks, each comparison block comprising:
      i) a bitwise sample latch;
      ii) a bitwise pattern latch; and
      iii) a comparator receiving an output from the bitwise sample and pattern latches; and
   b) an output derived from one or more of the one or more comparison blocks.

4. Apparatus as in claim 3, wherein each of the bitwise sample latches receives a number of microprocessor signals in response to a qualified clock signal.

5. Apparatus as in claim 4, wherein the programmable means for alternately placing the trigger means in synchronous or asynchronous mode comprises a number of programmable signals, wherein the programmable signals:
   a) are received by said one or more trigger means; and
   b) determine the qualification of the qualified clock signals.

6. Apparatus as in claim 4, wherein for each of the one or more trigger means:
   a) outputs of a first subset of a trigger means' one or more comparison blocks are received by a first AND gate corresponding to the trigger means;
   b) outputs of a second subset of the trigger means' one or more comparison blocks are received by a second AND gate corresponding to the trigger means; and
   c) outputs of the first and second AND gates of a trigger means are received by a multiplexor corresponding to the trigger means so that a trigger is generated in response to the output of either the first or the second of a trigger means' AND gates.

7. Apparatus as in claim 6, wherein the programmable means for alternately placing the trigger means in synchronous or asynchronous mode comprises a number of programmable signals, wherein the programmable signals:
   a) are received by said one or more trigger means;
   b) determine the qualification of the qualified clock signals; and
   c) program select line(s) of the multiplexors so as to determine which programmed values of microprocessor signals must be detected in order to generate the number of triggers.

8. Apparatus as in claim 7, wherein a trigger means' second AND gate receives one or more validity signals indicative of whether one or microprocessor signals are valid.

9. Apparatus as in claim 3, wherein each of the comparison blocks of the one or more trigger means further comprises a bitwise mask latch, wherein the comparator of a comparison block also receives an output from its corresponding bitwise mask latch.

10. Apparatus as in claim 1, wherein the one or more trigger means comprise:

a) an instruction address trigger means;

b) a data address trigger means; and c) an instruction data trigger means.

11. Apparatus as in claim 1, further comprising an iteration counter, wherein the iteration counter is stepped in response to an output of a first of the event generation means, and provides an enable signal to one or more of the event generation means other than the first of the event generation means.

12. Apparatus as in claim 1, further comprising a countdown timer, wherein the countdown timer is enabled by a programmed combination of the number of triggers generated by said trigger means, and prohibits a first of the event generation means from generating a microprocessor event until the countdown timer has elapsed.

13. A method of synchronously and/or asynchronously generating events within a microprocessor, the method comprising the steps of:

a) sampling signals internal to the microprocessor;

b) generating a number of triggers as programmed values of the internal signals are detected within the microprocessor; c) generating one or more microprocessor events in response to programmed combinations of the number of triggers generated; and d) alternately placing one or more trigger means internal to the microprocessor in synchronous mode, wherein the sampling of internal signals occurs synchronous to a clock which steps an instruction pipeline, or in asynchronous mode, wherein the sampling of internal signals occurs asynchronous to a clock which steps an instruction pipeline.

14. A method as in claim 13, wherein:

a) the step of sampling signals internal to the microprocessor comprises sampling the signals in response to one or more qualified clocks; and b) the step of alternately placing the trigger means in synchronous or asynchronous mode comprises:

i) ANDing a number of programmable signals with the one or more qualified clocks; and ii) using the number of programmable signals to determine which programmed values of the internal signals must be detected in order to generate the number of triggers.

15. A method as in claim 13, wherein generating a single trigger comprises the steps of:

a) programming one or more bitwise pattern latches; and b) comparing the contents of each bitwise pattern latch to the contents of a corresponding bitwise sample latch.

16. A method as in claim 15, wherein the step of comparing the contents of a bitwise pattern latch to the contents of a bitwise sample latch comprises performing a comparison in response to a qualified clock signal.

17. A method as in claim 16, wherein the step of alternately placing the trigger means in synchronous or asynchronous mode comprises ANDing a number of programmable signals with the one or more qualified clocks.

18. A method as in claim 16, wherein generating a single trigger comprises:

a) logically ANDing the results of a first subset of pattern latch/sample latch comparisons;

b) logically ANDing the results of a second subset of pattern latch/sample latch comparisons; and c) multiplexing the results of the two logical ANDings to generate a trigger.

19. A method as in claim 18, wherein the step of alternately placing the trigger means in synchronous or asynchronous mode comprises:

a) ANDing a number of programmable signals with the one or more qualified clocks; and b) using the number of programmable signals to determine which programmed values of the internal signals must be detected in order to generate the number of triggers.

20. A method as in claim 19, wherein generating a single trigger comprises logically ANDing one or more validity signals indicative of whether one or microprocessor signals are valid into the second subset of pattern latch/sample latch comparisons.

* * * * *